United States Patent
Cheng et al.

(10) Patent No.: US 11,374,071 B2
(45) Date of Patent: Jun. 28, 2022

(54) ARRAY SUBSTRATE HAVING LIGHT WAVE PARTITION GROOVES AND DISPLAY DEVICE

(71) Applicant: BOE TECHNOLOGY GROUP CO., LTD., Beijing (CN)

(72) Inventors: Hongfei Cheng, Beijing (CN); Yong Qiao, Beijing (CN); Xinyin Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 599 days.

(21) Appl. No.: 16/330,694

(22) PCT Filed: Aug. 8, 2018

(86) PCT No.: PCT/CN2018/099326
§ 371 (c)(1),
(2) Date: Mar. 5, 2019

(87) PCT Pub. No.: WO2019/047661
PCT Pub. Date: Mar. 14, 2019

(65) Prior Publication Data
US 2021/0343803 A1  Nov. 4, 2021

(30) Foreign Application Priority Data
Sep. 6, 2017 (CN) .......................... 201721137287.8

(51) Int. Cl.
*H01L 27/32* (2006.01)
*H01L 51/50* (2006.01)
*H01L 51/52* (2006.01)

(52) U.S. Cl.
CPC ...... *H01L 27/3246* (2013.01); *H01L 27/3213* (2013.01); *H01L 51/5096* (2013.01); *H01L 51/5237* (2013.01)

(58) Field of Classification Search
CPC ............. H01L 27/3246; H01L 27/3213; H01L 51/5096; H01L 51/5237
(Continued)

(56) References Cited

U.S. PATENT DOCUMENTS 8,754,577 B2  6/2014  Nishi et al.
2002/0089497 A1  7/2002  Yudasaka
(Continued)

FOREIGN PATENT DOCUMENTS

CN  1510974 A  7/2004
CN  106920891 A  7/2017
(Continued)

OTHER PUBLICATIONS

International Search Report and Written Opinion for Application No. PCT/CN2018/099326, dated Nov. 16, 2018, 10 Pages.
(Continued)

*Primary Examiner* — Xia L Cross
(74) *Attorney, Agent, or Firm* — Brooks Kushman P.C.

(57) ABSTRACT

The present disclosure provides an array substrate and a display device. The array substrate comprises a plurality of pixel units arranged in an array, each pixel unit including a light emitting unit and a pixel definition layer disposed around the light emitting unit; wherein in at least one pixel unit, a light wave partition groove is provided in the pixel definition layer on at least one side of the light emitting unit, and a light wave blocking layer is provided in the light wave partition groove.

5 Claims, 4 Drawing Sheets

(58) Field of Classification Search
USPC .......................................................... 257/40
See application file for complete search history.

(56) References Cited

U.S. PATENT DOCUMENTS

| | | |
|---|---|---|
| 2002/0101152 A1 | 8/2002 | Kimura |
| 2004/0119398 A1* | 6/2004 | Koo .................. H01L 51/5271 |
| | | 313/499 |
| 2006/0155784 A1 | 7/2006 | Kusters et al. |
| 2008/0220683 A1 | 9/2008 | Koo et al. |
| 2015/0021560 A1* | 1/2015 | Jeong ................. H01L 51/5228 |
| | | 438/34 |
| 2015/0097168 A1 | 4/2015 | Hanawa et al. |
| 2016/0126304 A1* | 5/2016 | Cho .................... H01L 51/5228 |
| | | 257/40 |
| 2016/0155784 A1 | 6/2016 | Park et al. |
| 2017/0186823 A1* | 6/2017 | Kim .................... H01L 51/5237 |
| 2017/0221399 A1* | 8/2017 | Yan ....................... G09G 3/2003 |
| 2019/0103418 A1 | 4/2019 | Han |

FOREIGN PATENT DOCUMENTS

| | | |
|---|---|---|
| CN | 107134543 A | 9/2017 |
| CN | 207116483 U | 3/2018 |
| JP | 2003031355 A | 1/2003 |

OTHER PUBLICATIONS

First Office Action for Russian Application No. 2019115831/28, dated Oct. 8, 2020, 5 Pages.
Search Report for Russian Application No. 2019115831/28, dated Oct. 8, 2020, 2 Pages.
1$^{st}$ Russian Office Action, English Translation.
Russian Search Report, English Translation.
Extended European Search Report for Application No. 18853703.9, dated Jul. 2, 2021, 8 Pages.

* cited by examiner

ARRAY SUBSTRATE HAVING LIGHT WAVE PARTITION GROOVES AND DISPLAY DEVICE

CROSS-REFERENCE TO RELATED APPLICATIONS

This application is the U.S. national phase of PCT Application No. PCT/CN2018/099326 filed on Aug. 8, 2018, which claims priority to Chinese patent application No. 201721137287.8 filed on Sep. 6, 2017, which are incorporated herein by reference in their entireties.

TECHNICAL FIELD

The present disclosure relates to the field of display technology, and in particular to an array substrate and a display device.

BACKGROUND

Organic light emitting diodes (OLEDs), especially active-matrix organic light emitting diodes (AMOLEDs), have the advantages of high brightness, full viewing angle, fast response and flexible display, and thus have been widely applied in display field.

SUMMARY

The present disclosure provides an array substrate and a display device.

First aspect of the present disclosure provides an array substrate, comprising a plurality of pixel units arranged in an array, each pixel unit including a light emitting unit and a pixel definition layer disposed around the light emitting unit; wherein in at least one of the pixel units, a light wave partition groove is provided in the pixel definition layer on at least one side of the light emitting unit, and a light wave blocking layer is provided in the light wave partition groove.

Optionally, the light wave partition groove having a ring shape surrounds the light emitting unit in the pixel unit; or the light wave partition wave is linearly arranged on at least one side of the light emitting unit in the pixel unit.

Optionally, the light wave partition grooves include row light wave partition grooves parallel with a row direction of pixel units, and/or column light wave partition grooves parallel with a column direction of pixel units; wherein, a length of the row light wave partition groove along the row direction of pixel units is greater than or equal to a length of the light emitting unit along the row direction of pixel units; and a length of the column light wave partition groove along the column direction of pixel units is greater than or equal to a length of the light emitting unit along the column direction of pixel units.

Optionally, adjacent row light wave partition grooves in a same row are communicated with each other; and/or adjacent column light wave partition grooves in a same column are communicated with each other.

Optionally, the light emitting unit is an organic light emitting diode (OLED) which comprises an anode and a cathode disposed opposite to each other, and an OLED light emitting layer between the anode and the cathode; and the light wave blocking layer is an extension part of the cathode.

Optionally, a planarization layer and/or a passivation layer is arranged on a side of the anode away from the cathode, an extension slot of the light wave partition groove is provided in an area of the planarization layer and/or the passivation layer corresponding to the light wave partition groove, and the light wave blocking layer further covers the extension slot.

Optionally, the array substrate comprises red pixel units, green pixel units, blue pixel units and white pixel units; a pixel unit group composed of a red pixel unit, a green pixel unit and a blue pixel unit is provided on each of two sides of a white pixel unit along a row direction of pixel units or a column direction of pixel units, and the white pixel unit is arranged to be adjacent to the red pixel unit, the green pixel unit, or the blue pixel unit of the pixel unit group; wherein, at least one of the pixel units provided with the light wave partition groove is the white pixel unit; and the light emitting unit in the white pixel unit is a white OLED.

Optionally, the array substrate comprises red pixel units, green pixel units, blue pixel units and white pixel units; a pixel unit group composed of a red pixel unit, a green pixel unit and a blue pixel unit is provided on each of two sides of a white pixel unit along a row direction of pixel units or a column direction of pixel units, and the white pixel unit is arranged to be adjacent to the red pixel unit, the green pixel unit, or the blue pixel unit of the pixel unit group; wherein, at least one of the pixel units provided with the light wave partition groove is the red pixel unit adjacent to the white pixel unit; or at least one of the pixel units provided with the light wave partition groove is the green pixel unit adjacent to the white pixel unit; or at least one of the pixel units provided with the light wave partition groove is the blue pixel unit adjacent to the white pixel unit; and the light emitting unit in the white pixel unit is a white OLED.

Optionally, no light wave partition groove is provided between any two of the red pixel unit, the green pixel unit and the blue pixel unit in the pixel unit group.

Optionally, the light emitting unit in the red pixel unit is a red OLED; the light emitting unit in the green pixel unit is a green OLED; and the light emitting unit in the blue pixel unit is a blue OLED.

Optionally, the light emitting unit in the red pixel unit is a white OLED, and the red pixel unit further comprises a red color filter provided on a light exiting side of the white OLED;

the light emitting unit in the green pixel unit is a white OLED, and the green pixel unit further comprises a green color filter provided on a light exiting side of the white OLED; and the light emitting unit in the blue pixel unit is a white OLED, and the blue pixel unit further comprises a blue color filter provided on a light exiting side of the white OLED.

A second aspect of the present disclosure provides a display device, comprising the aforesaid array substrate.

DETAILED DESCRIPTION

For better understanding, the array substrate and display device provided by embodiments of the present disclosure will be described hereinafter in details in conjunction with the drawings.

Currently, an array substrate adopting AMOLEDs is provided with a plurality of pixel units arranged in an array, and each pixel unit comprises an OLED and a pixel definition layer disposed around the OLED. However, after entering the pixel definition layer, part of output light of the OLED is likely to cause light interference to an adjacent pixel unit, that is, the part of output light of the OLED which enters the pixel definition layer is likely to affect light output effect of the adjacent pixel unit, which will reduce display quality of a display device provided with the array substrate.

Figure 1:
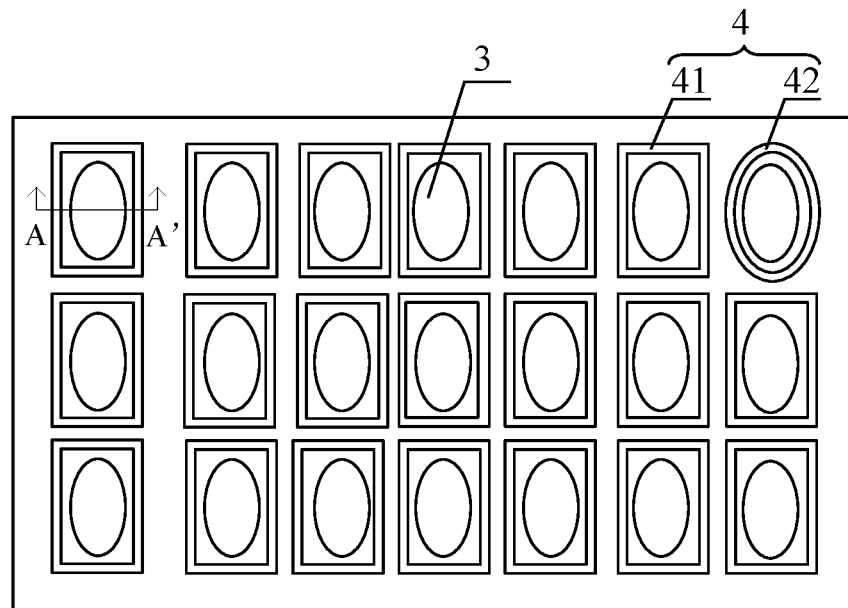
FIG. 1 is a schematic structural diagram of an array substrate provided by some embodiments of the present disclosure.
Figure 2:
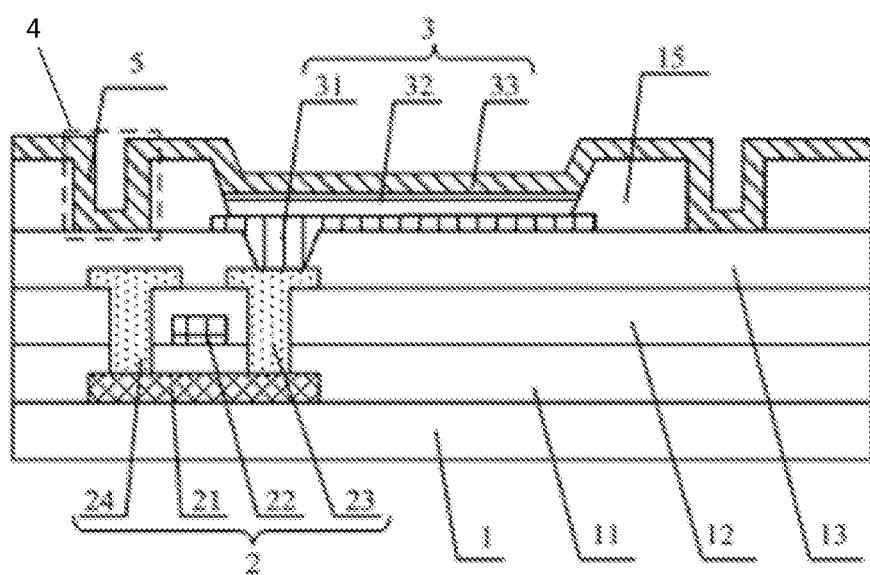
FIG. 2 is A-A' sectional view I of the array substrate provided by some embodiments of the present disclosure of FIG. 1.

FIG. 1 is a schematic structural diagram of an array substrate provided by some embodiments of the present disclosure, and FIG. 2 is A-A' sectional view I of the array substrate provided by some embodiments of the present disclosure of FIG. 1. With reference to FIGS. 1 and 2, an array substrate provided by some embodiments of the present disclosure comprises a plurality of pixel units arranged in an array, each pixel unit including a light emitting unit 3 and a pixel definition layer 15 disposed around the light emitting unit 3; wherein in at least one pixel unit, a light wave partition groove 4 is provided in the pixel definition layer 15 on at least one side of the light emitting unit, and a light wave blocking layer 5 is provided in the light wave partition groove 4.

Figure 5:
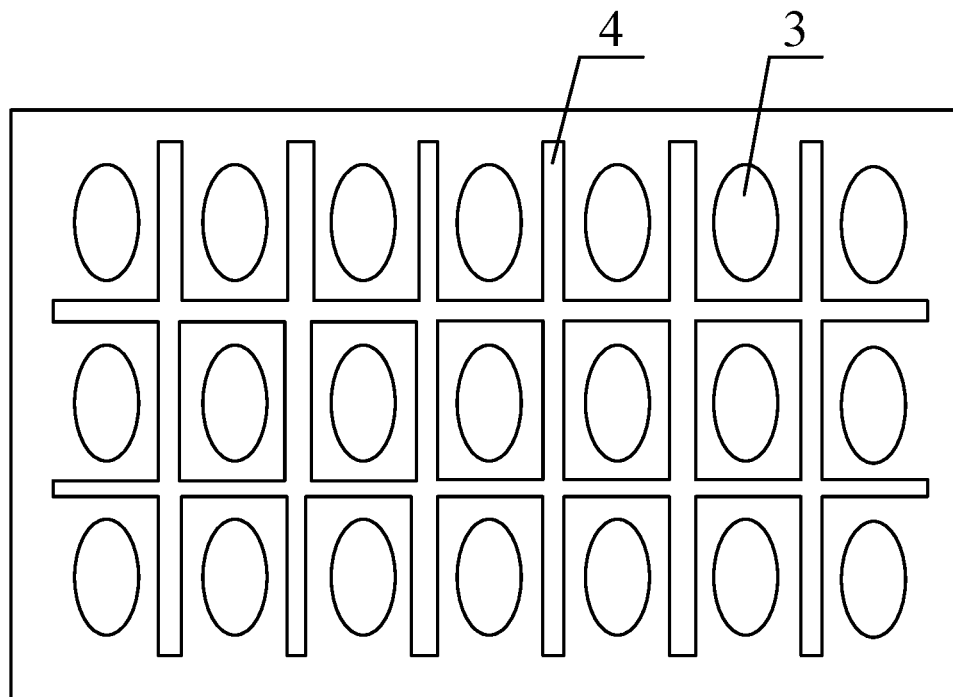
FIG. 5 is distribution diagram I of light wave partition grooves provided by some embodiments of the present disclosure.

In the above embodiments, the light wave partition groove 4 is configured to cut off a connection between the present pixel unit and an adjacent pixel unit on the pixel definition layer 15. The light wave partition groove 4 may be arranged in a plurality positions in the pixel definition layer 15, for example, as shown in FIG. 1, the light partition groove 4 is arranged in the pixel definition layer 15 inside the present pixel unit. As shown in FIG. 5 which is distribution diagram I of light wave partition grooves provided by some embodiments of the present disclosure, the light wave partition groove 4 is arranged at the periphery of the pixel definition layer 15 of the present pixel unit, that is, at a boundary between the present pixel unit and an adjacent pixel unit, in which case the light wave partition groove 4 may correspondingly belong to either one of the present pixel unit and the adjacent pixel unit. The light wave partition groove 4 may be set in a plurality of shapes, for illustration purposes, the light wave partition groove 4 is set in a ring shape to surround a light emitting unit 3 of a corresponding pixel unit, such as a rectangular ring groove 41 or elliptical ring groove 42 as shown in FIG. 1; the light wave partition groove 4 may also be set in segments, for example, the light wave partition wave 4 is linearly arranged on at least one side of a light emitting unit 3 in a corresponding pixel unit, that is, it is possible to linearly arrange the light wave partition waves 4 on both sides of a light emitting unit 3 in each pixel unit; it is possible to linearly arrange the light wave partition groove 4 on only one side of the light emitting unit 3, and linearly arrange another light wave partition groove 4 on one side of a light emitting unit in an adjacent pixel unit which is on the other side of the light emitting unit 3, with the one side of a light emitting unit in the adjacent pixel unit being close to the light emitting unit 3; it is possible to linearly arrange the light wave partition groove 4 on neither side of the light emitting unit 3, but to linearly arrange the light wave partition groove 4 on one side of a light emitting unit in each of two adjacent pixel units which are on the two sides of the light emitting unit 3, with the one side of the light emitting unit being close to the light emitting unit 3; and it is also possible to linearly arrange the light wave partition grooves 4 both in the light emitting unit 3 and on one side of a light emitting unit close to the light emitting unit 3 in an adjacent pixel unit, as long as at least one light wave partition groove 4 is arranged between the light emitting units of two adjacent pixel units.

Furthermore, the light wave blocking layer 5 may be made of a light-shielding material, such as a light-shielding metal, or be made of a transparent material the refractive index and reflectivity of which are different from those of a material of the pixel definition layer 15. The pixel definition layer 15 is generally made of organic resin materials.

In the array substrate provided by some embodiments of the present disclosure, the light wave partition groove 4 is provided in the pixel definition layer 15 in at least one pixel unit, and the light wave blocking layer 5 is provided in the light wave partition groove 4, such that a connection between the present pixel unit and an adjacent pixel unit on the pixel definition layer 15 is cut off by the light wave partition groove 4. When part of output light of the light emitting unit 3 enters the pixel definition layer 15 and is propagated to the light wave partition groove 4, the light wave blocking layer 5 provided in the light wave partition groove 4 may avoid total reflection of the part of output light in the pixel definition layer 15, and prevent the part of output light from being continuously propagated along every reflection path in the pixel definition layer 15, so that the pixel definition layer 15 will not serve as a light wave conductor, so as to effectively reduce light wave interference of the present pixel unit to the adjacent pixel unit, or reduce light wave interference of the adjacent pixel unit to the present pixel unit, thereby improving the display quality of the display device provided with the array substrate.

Figure 6:
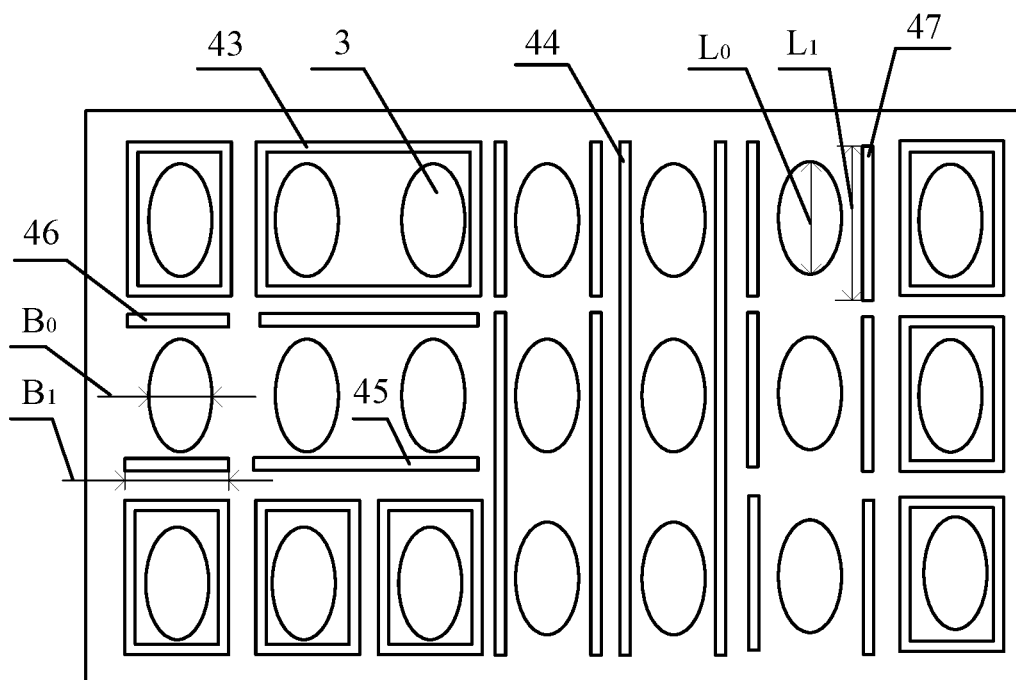
FIG. 6 is distribution diagram II of light wave partition grooves provided by some embodiments of the present disclosure.

It should be noted that, when the light wave partition groove 4 is linearly arranged in segments in the above embodiments, a direction of each segment of the light wave partition groove 4 may be set according to practical needs. With reference to FIG. 6 which is distribution diagram II of light wave partition grooves provided by some embodiments of the present disclosure, the light wave partition grooves parallel with a row direction of pixel units are defined as row light wave partition grooves 46, and the light wave partition grooves parallel with a column direction of pixel units are defined as column light wave partition grooves 47, in which case the light wave partition grooves 4 in the array substrate provided by the embodiment include the row light wave partition grooves 46 and/or the column light wave partition grooves 47, and a length B1 of the row light wave partition groove 46 along the row direction of pixel units is greater than or equal to a length B0 of a light emitting unit 3 along the row direction of pixel units, a length L1 of the column light wave partition groove 47 along the column direction of pixel units is greater than or equal to a length L0 of the light emitting unit 3 along the column direction of pixel units. The row light wave partition groove 46 and/or the column light wave partition groove 47 is capable of preventing the output light of the light emitting unit 3 from being propagated in the pixel definition layer 15 by the light wave blocking layer 5 provided in the light wave partition groove 4, so as to effectively reduce light wave interference of the present pixel unit to the adjacent pixel unit, or reduce light wave interference of the adjacent pixel unit to the present pixel unit, thereby improving the display quality of the display device provided with the array substrate.

Additionally, with reference to FIGS. 5 and 6, in the array substrate provided by some embodiments of the present disclosure, for facilitating fabrication of the light wave partition groove 4, when being set in a ring structure, the light wave partition groove 4 may be set in a ring to surround two or more adjacent light emitting units 3, such as a common ring groove 43 in FIG. 6; when the light wave partition groove 4 is linearly arranged in segments, adjacent row light wave partition grooves 4 in a same row may be communicated with each other to form a horizontal groove 45 shown in FIG. 6, and adjacent column light wave partition grooves 4 in a same column may be similarly communicated with each other to form a vertical groove 44 shown in FIG. 6. Moreover, when every light wave partition groove 4 is arranged at a boundary between the present pixel unit and an adjacent pixel unit, adjacent light wave partition grooves 4 may be communicated with each other, so that every row light wave partition groove 4 and every column light wave partition groove 4 intersect with each other to form a grid in the pixel definition layer 15 as shown in FIG. 5, with each light emitting unit being correspondingly disposed in a square defined by the intersecting row light wave partition groove 4 and column light wave partition groove 4.

With reference to FIG. 2, it should be understood that, in the array substrate provided by the above embodiments, the light emitting unit 3 in the pixel unit may adopt an OLED which generally comprises an anode 31 and a cathode 33 disposed opposite to each other, and an OLED light emitting layer 32 therebetween; wherein, the anode 31 is usually made of indium tin oxide (ITO); the OLED light emitting layer 32 may be a single-layer organic light emitting layer, or a multilayer structure composed of a hole transport layer, an organic light emitting layer and an electron transport layer; and the cathode 33 is usually made of a metal material, such as Al and an alloy thereof. An extension part of the cathode 33 may be used as the light wave blocking layer 5, which may simplify fabrication process of the array substrate and increase production efficiency of the array substrate.

With reference to FIG. 2, it should be noted that, in the array substrate provided by some embodiments of the present disclosure, a thin film transistor 2 is usually disposed between the light emitting unit 3 and a base substrate 1 for driving the light emitting unit 3 to emit light. The thin film transistor 2 may be any one of oxide semiconductor thin film transistors, polysilicon thin film transistors, and amorphous silicon thin film transistors, and may be a top-gate thin film transistor or a bottom-gate thin film transistor, which is not specifically limited herein.

For illustration purposes, with reference to FIG. 2, some embodiments of the present disclosure provides a top-gate thin film transistor, comprising an active layer 21, a gate insulation layer 11, a gate 22 and an interlayer insulation layer 12 which are stacked on the base substrate 1, a drain 23 and a source 24 are respectively arranged on the interlayer insulation layer 12, both the interlayer insulation layer 12 and the gate insulation layer 11 are provided therein with vias corresponding to the drain 23 and the source 24, and the drain 23 and the source 24 are connected to the active layer 21 through the corresponding vias respectively; and a passivation layer 13 and a pixel definition layer 15 are provided on upper surfaces of the drain 23 and the source 24, a plurality opening areas corresponding the OLEDs are arranged in the pixel definition layer 15, and the OLED is provided in the opening area of the pixel definition layer 15. A via corresponding to the anode 31 is arranged in the passivation layer 13, and the anode 31 of the OLED is connected to the drain 23 through the via in the passivation layer 13. The active layer 21 may be made of indium gallium zinc oxide (IGZO). Both the gate insulation layer 11 and the interlayer insulation layer 12 may be single-layer structures, such as silicon nitride layers and silicon oxide layers, or multilayer structures, such as a laminated structure composed of silicon nitride layers and silicon oxide layers; and the passivation layer 13 may be a silicon nitride layer.

In the array substrate shown in FIG. 2, since the pixel definition layer 15 is arranged to be adjacent to the passivation layer 13, when part of output light of the OLED enters the passivation layer 13, it is likely that transverse propagation of the part of output light causes light wave interference to an adjacent pixel unit. Therefore, with reference to FIG. 3 which is A-A' sectional view II of the array substrate provided by some embodiments of the present disclosure of FIG. 1, and FIG. 4 which is A-A' sectional view III of the array substrate provided by some embodiments of the present disclosure of FIG. 1, for further reducing light wave interference between adjacent pixel units, in the array substrate provided by the embodiment, if other layers are provided on a side of the anode 31 of the OLED away from the cathode 33, such as a planarization layer 14 and/or the passivation layer 13, the light wave partition groove 4 may be extended into the planarization layer 14 and/or the passivation layer 13, and a part of the light wave partition groove 4 extending in the planarization layer 14 and/or the passivation layer 13 forms an extension slot 40 which increases a depth of the light wave partition groove 4 and allows the light wave partition groove 4 to extend into the planarization layer 14 and/or the passivation layer 13. The extended light wave partition groove 4 further cuts off connection between the pixel unit and an adjacent pixel unit in other layers such as the planarization layer 14 and/or the passivation layer 13, so as to effectively avoid transverse propagation of the output light in other layers and consequent light interference caused to the adjacent pixel unit. Wherein, the planarization layer 14 may be made of a polymer resin material or a photoresist material.

Figure 3:
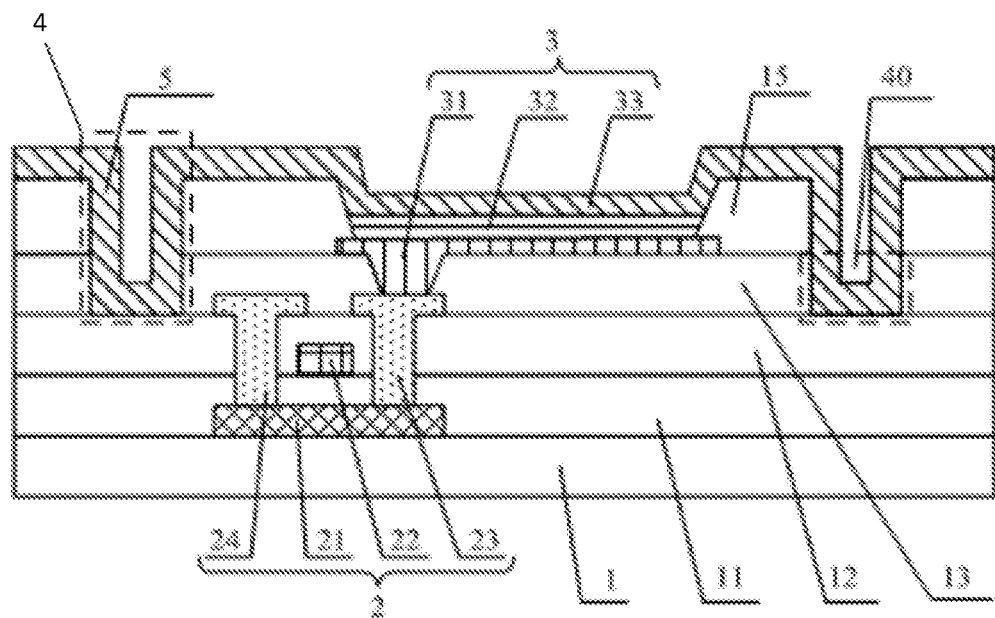
FIG. 3 is A-A' sectional view II of the array substrate provided by some embodiments of the present disclosure of FIG. 1.

With reference to FIG. 3, for example, the passivation layer 13 is arranged on a side of the anode 31 of the OLED away from the cathode 33, that is, when the pixel definition layer 15 is arranged to be adjacent to the passivation layer 13, the light wave partition groove 4 is arranged in the pixel definition layer 15 and the passivation layer 13, a part of the light wave partition groove 4 extending between the pixel definition layer 15 and the passivation layer 13 forms the extension slot 40, and the light wave blocking layer 5 covers the whole light wave partition groove 4. In this case, if part of output light of the light emitting unit 3 enters the pixel definition layer 15 and/or the passivation layer 13 and is propagated to the light wave partition groove 4, the light wave blocking layer 5 provided in the light wave partition groove 4 may prevent the part of output light of the light emitting unit 3 from being propagated in the pixel definition layer 15 and/or the passivation layer 13 and prevent the pixel definition layer 15 and/or the passivation layer 13 from serving as a light wave conductor, so as to effectively reduce light wave interference of the present pixel unit to the adjacent pixel unit, or reduce light wave interference of the adjacent pixel unit to the present pixel unit, thereby improving the display quality of the display device provided with the array substrate.

Figure 4:
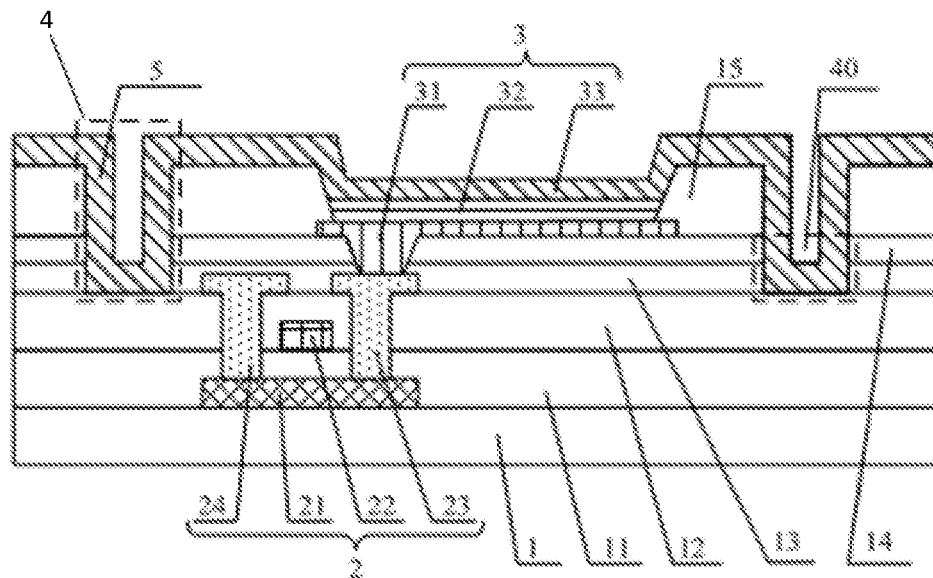
FIG. 4 is A-A' sectional view III of the array substrate provided by some embodiments of the present disclosure of FIG. 1.

When the passivation layer 14 and the passivation layer 13 are sequentially arranged on the side of the anode 31 of the OLED away from the cathode 33, the light wave partition groove 4 is arranged as shown in FIG. 4 with similar technical principle and effects, which will not described herein in detail.

Figure 7:
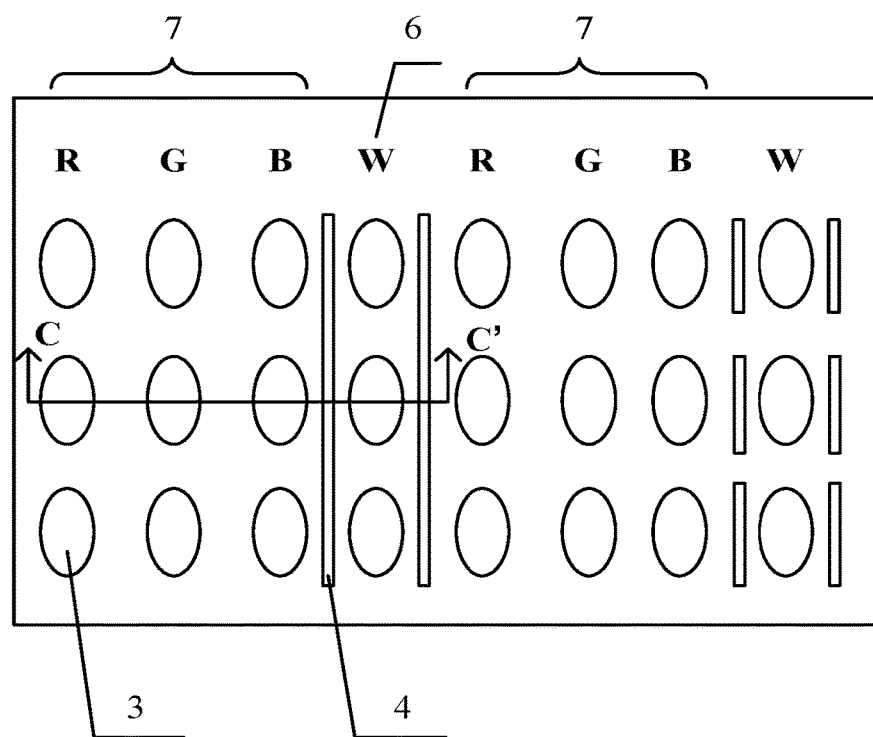
FIG. 7 is a schematic structural diagram of an RGBW-type array substrate provided by some embodiments of the present disclosure.

With reference to FIG. 7 which is a schematic structural diagram of an RGBW-type array substrate provided by some embodiments of the present disclosure, it should be noted that, in an array substrate in RGBW four-color pixel mode, pixel units usually include red pixel units (R), green pixel units (G), blue pixel units (B) and white pixel units (W) 6; wherein, a pixel unit group 7 composed of a red pixel unit (R), a green pixel unit (G) and a blue pixel unit (B) is provided on each side of a white pixel unit (W) 6 along a row direction of pixel units or a column direction of pixel units. Since the red pixel unit (R), green pixel unit (G) and blue pixel unit (B) in the pixel unit group 7 may be arranged in random order, the white pixel unit (W) 6 may be arranged to be adjacent to the red pixel unit (R), the green pixel unit (G), or the blue pixel unit (B) of the pixel unit group 7.

Since the red pixel unit (R) emits red light, the green pixel unit (G) emits green light, the blue pixel unit (B) emits blue light and the white pixel unit (W) 6 emits white light, the white pixel unit (W) 6 has higher brightness than the red pixel unit (R), the green pixel unit (G) and the blue pixel unit (B) of the pixel unit group 7, and will significantly affect the light output effects of the red pixel unit (R), the green pixel unit (G) and the blue pixel unit (B) of the adjacent pixel unit group 7. Therefore, with reference to FIG. 7, in some embodiments of the present disclosure, the light wave partition grooves 4 are provided between a light emitting unit 3 of at least one white pixel unit (W) 6 and adjacent pixel unit groups 7, that is, the light wave partition grooves 4 are provided between the light emitting unit 3 of at least one white pixel unit (W) 6 and light emitting units 3 of an adjacent red pixel units (R), or between the light emitting unit 3 of at least one white pixel unit (W) 6 and light emitting units 3 of an adjacent green pixel units (G), or between the light emitting unit 3 of at least one white pixel unit (W) 6 and light emitting units of an adjacent blue pixel units (B), so that the light wave blocking layers in the light wave partition grooves 4 may effectively reduce light wave interference caused by the white pixel unit (W) 6 to the red pixel units (R), the green pixel units (G) and the blue pixel units (B) of the adjacent pixel unit groups 7, so as to avoid color gamut drop of light output from the array substrate and guarantee good display quality of the display device provided with the array substrate.

It should be noted that the light emitting unit 3 in the white pixel unit (W) 6 is a white OLED, when the light wave partition grooves 4 are provided between the light emitting unit 3 of the white pixel unit (W) 6 and the adjacent pixel unit group 7, the light wave partition groove 4 may be arranged on a side of the white OLED of the white pixel unit (W) 6 close to the adjacent pixel unit group 7, that is, the light wave partition groove 4 may be arranged in an area of a pixel definition layer in the white pixel unit (W) 6 close to the adjacent pixel unit group 7; the light wave partition groove 4 may also be arranged in other pixel unit of the pixel unit group 7 adjacent to the white pixel unit (W) 6, for example, the light wave partition groove 4 may be arranged on a side of the light emitting unit 3 of the red pixel unit (R) adjacent to the white pixel unit (W) 6 when the red pixel unit (R) is adjacent to the white pixel unit (W) 6, or may be arranged on a side of the light emitting unit 3 of the green pixel unit (G) adjacent to the white pixel unit (W) 6 when the green pixel unit (G) is adjacent to the white pixel unit (W) 6, or may be arranged on a side of the light emitting unit 3 of the blue pixel unit (B) adjacent to the white pixel unit (W) 6 when the blue pixel unit (B) is adjacent to the white pixel unit (W) 6. Furthermore, the light wave partition groove 4 may be arranged at a boundary between the pixel unit group 7 and the white pixel unit (W) 6, or may be arranged on each of two sides of the boundary between the pixel unit group 7 and the white pixel unit (W) 6, which will not be described herein in detail.

For illustration purposes, with reference to FIG. 7, in some embodiments of the present disclosure, the pixel unit groups 7 are provided on both sides of the white pixel units (W) 6 along the row direction of pixel units, in which case column light wave partition grooves may be adopted as the light wave partition grooves 4, and may be arranged on both sides of the light emitting units 3 of the white pixel units (W) 6 close to the pixel unit groups 7. Since the pixel unit group 7 is composed of the red pixel unit (R), the green pixel unit (G) and the blue pixel unit (B), and light interference between any two of the red pixel unit (R), the green pixel unit (G) and the blue pixel unit (B) is smaller than light interference caused by the white pixel unit (W) to the red pixel unit (R), the green pixel unit (G) and the blue pixel unit (B), it is possible not to arrange the light wave partition groove 4 between any two of the red pixel unit (R), the green pixel unit (G) and the blue pixel unit (B) in the pixel unit group 7, that is, it is possible not to arrange the light wave partition groove 4 between any two adjacent light emitting units 3 of the red pixel unit (R), the green pixel unit (G) and the blue pixel unit (B) in the pixel unit group 7, which may reduce the amount of the light wave partition grooves 4 and process difficulty.

Additionally, in the above embodiments, the light emitting unit in the red pixel unit (R) may be a red OLED; the light emitting unit in the green pixel unit (G) may be a green OLED; and the light emitting unit in the blue pixel unit (B) may be a blue OLED.

Figure 8:
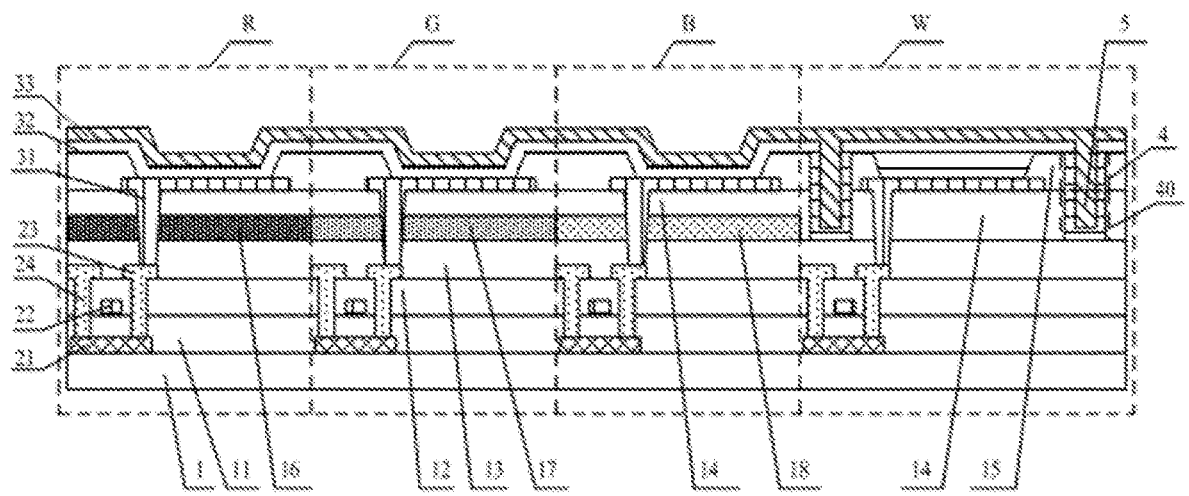
FIG. 8 is a C-C' sectional view of the RGBW-type array substrate provided by some embodiments of the present disclosure of FIG. 7.

Moreover, with reference to FIG. 8 which is a C-C' sectional view of the RGBW-type array substrate provided by some embodiments of the present disclosure of FIG. 7, since the light emitting unit in the white pixel unit (W) is the white OLED, for facilitating fabrication of the array substrate, all the light emitting units in the red pixel unit (R), the green pixel unit (G) and the blue pixel unit (B) may be white OLEDs, with a red color filter 16 being provided on a light exiting side of the white OLED in the red pixel unit (R), a green color filter 17 being provided on a light exiting side of the white OLED in the green pixel unit (G), and a blue color filter 18 being provided on a light exiting side of the white OLED in the blue pixel unit (B).

For illustration purposes, with reference to FIG. 8, in the embodiment, all the light emitting units in the red pixel unit (R), the green pixel unit (G), the blue pixel unit (B) and the white pixel unit (W) are white OLEDs; the OLED light emitting layer 32 and the cathode 33 in each white OLED may be integrally formed, that is, may be set as a whole layer. In this case, the light wave blocking layer 5 correspondingly arranged in the light wave partition groove 4 and the extension slot 40 thereof may be a part of the laminated layer of the OLED light emitting layer 32 and the cathode 33.

With reference to FIG. 8, in the present embodiment, the white OLEDs adopt a bottom emission mode, that is, the light exiting side of the white OLED is on the side of the anode 31 thereof; when a planarization layer 14 and a passivation layer 13 are stacked between the anode 31 of the white OLED and the source and drain of the thin film transistor, the red color filter 16 of the red pixel unit (R) may be arranged in an area corresponding to the red pixel unit (R) between the planarization layer 14 and the passivation layer 13, the green color filter 17 of the green pixel unit (G) may be arranged in an area corresponding to the green pixel unit (G) between the planarization layer 14 and the passivation layer 13, and the blue color filter 18 of the blue pixel unit (B) may be arranged in an area corresponding to the blue pixel unit (B) between the planarization layer 14 and the passivation layer 13; and no color filter is arranged in an area corresponding to the white pixel unit (W) between the planarization layer 14 and the passivation layer 13. In this case, the light wave partition groove 4 extends from the pixel definition layer 15 into the planarization layer 14, a part of the light wave partition groove 4 extending between the pixel definition layer 15 and the planarization layer 14 forms the extension slot 40, and the light wave blocking layer 5 covers the whole light wave partition groove 4. When white light emitted from the white OLED passes through the color filer and is converted into respective colored light, the light wave blocking layer 5 provided in the extension slot 40 in the light wave partition groove 4 may avoid total reflection of the respective colored light (such as blue light) in the planarization layer 14, and prevent the part of output light from being continuously propagated along every reflection path in the planarization layer 14, so that the planarization layer 14 will not serve as a light wave conductor, so as to effectively reduce light wave interference of the pixel unit to the adjacent pixel unit, thereby improving the display quality of the display device provided with the array substrate.

Some embodiments of the present disclosure further provide a display device, comprising the array substrate provided by the above embodiments. The array substrate of the display device has the same advantages as the array substrate provided by the above embodiments, which will not be described herein in detail.

The display device provided by the above embodiments may be a product or component having a display function, such as a mobile phone, a tablet computer, a TV, a display, a laptop, a digital photo frame and a navigator.

In the above description of implementations, specific features, structures, materials or characteristics may be combined in any one or more embodiments or examples in proper ways.

The above is optional embodiments of the present disclosure. It should be noted that those of ordinary skill in the art may make various improvements and modifications without departing from the principle of the present disclosure, and these improvements and modifications shall be considered to fall into the protection scope of the present disclosure.

What is claimed is:

1. An array substrate, comprising a plurality of pixel units arranged in an array, each pixel unit comprising a light emitting unit and a pixel definition layer disposed around the light emitting unit;
   wherein the array substrate comprises red pixel units, green pixel units, blue pixel units and white pixel units; a pixel unit group composed of a red pixel unit, a green pixel unit and a blue pixel unit is provided on each of two sides of each white pixel unit along a row direction, and the white pixel unit is arranged to be adjacent to the red pixel unit, the green pixel unit, or the blue pixel unit of the pixel unit group; wherein,
   in each white pixel unit, a light wave partition groove is provided in the pixel definition layer on two sides of the light emitting unit in the row direction, and a light wave blocking layer is provided in the light wave partition groove;
   and
   the light emitting unit in each white pixel unit is a white organic light emitting diode (OLED);
   wherein no light wave partition groove is provided between any two of the red pixel unit, the green pixel unit and the blue pixel unit in the pixel unit group.

2. The array substrate of claim 1, wherein the light emitting unit is an OLED comprising an anode and a cathode disposed opposite to each other, and an OLED light emitting layer between the anode and the cathode; and the light wave blocking layer is an extension part of the cathode.

3. The array substrate of claim 2, wherein a planarization layer and/or a passivation layer is arranged on a side of the anode away from the cathode, the light wave partition groove extends into the planarization layer and/or the passivation layer, and an extension part of the light wave partition groove is an extension slot.

4. The array substrate of claim 1, wherein,
   the light emitting unit in the red pixel unit is a white OLED, and the red pixel unit further comprises a red color filter provided on a light exiting side of the white OLED;
   the light emitting unit in the green pixel unit is a white OLED, and the green pixel unit further comprises a green color filter provided on a light exiting side of the white OLED; and
   the light emitting unit in the blue pixel unit is a white OLED, and the blue pixel unit further comprises a blue color filter provided on a light exiting side of the white OLED.

5. A display device, comprising the array substrate of claim 1.

* * * * *